US 8,705,023 B2

(12) United States Patent
Hong et al.

(10) Patent No.: US 8,705,023 B2
(45) Date of Patent: Apr. 22, 2014

(54) TESTING APPARATUS AND METHOD FOR TESTING LIGHT EMITTING DIODE LAMP

(75) Inventors: Sungho Hong, Seoul (KR); Jang Gu Oh, Seoul (KR); Tae Young Choi, Seoul (KR); Jong Tae Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 535 days.

(21) Appl. No.: 12/985,734

(22) Filed: Jan. 6, 2011

(65) Prior Publication Data

US 2011/0231130 A1     Sep. 22, 2011

(30) Foreign Application Priority Data

Mar. 22, 2010 (KR) .................. 10-2010-0025488
Mar. 22, 2010 (KR) .................. 10-2010-0025490

(51) Int. Cl.
*G01J 1/00*     (2006.01)
*G01J 1/42*     (2006.01)

(52) U.S. Cl.
CPC . *G01J 1/4257* (2013.01); *G01J 1/42* (2013.01)
USPC .......................................... 356/213; 356/218

(58) Field of Classification Search
CPC ................................. G01J 1/4257; G01J 1/42
USPC ................................................. 356/213–218
See application file for complete search history.

(56) References Cited

U.S. PATENT DOCUMENTS 7,812,624 B1 * 10/2010 Wei et al. ................. 324/762.07
2003/0161163 A1 * 8/2003 Hussey et al. ................. 362/487

FOREIGN PATENT DOCUMENTS

| JP | 5-159753 A | 6/1993 |
| JP | 3041201 B2 | 3/1996 |
| JP | 10-253697 A | 9/1998 |
| JP | 2009-121990 A | 6/2009 |
| KR | 1019990080582 A | 11/1999 |
| KR | 10-0281480 B1 | 11/2000 |
| KR | 10-2003-0025399 A | 3/2003 |
| KR | 10-2009-0072210 A | 7/2009 |
| KR | 10-0931322 B1 | 12/2009 |

* cited by examiner

*Primary Examiner* — Michael P Stafira
(74) *Attorney, Agent, or Firm* — McKenna Long & Aldridge LLP

(57) ABSTRACT

Disclosed is an apparatus for testing an LED lamp which includes: a secured seat on which the LED lamp is seated; an up and down shifter which, when the LED lamp is seated on the secured seat, shifts from an initial position spaced upward from the LED lamp to a measurement position in which the up and down shifter contacts with a socket of the LED lamp, and which supplies electric power to the LED lamp when the up and down shifter is placed in the measurement position, and a sensor sensing that the up and down shifter is placed in the measurement position; and a quality determining means determining a quality of the LED lamp based on light emitted from the LED lamp, and comprising an illuminometer or a luminance meter.

17 Claims, 8 Drawing Sheets

| order | Pass/Total | Serial No | measurement result | speed of light | color temperature | light efficiency | input current | Ev[lx] | x | y | u' | v' | X | Y | Z | Tcp | voltage | power factor | power consumption | V THD |
|---|---|---|---|---|---|---|---|---|---|---|---|---|---|---|---|---|---|---|---|---|
| 41 | 36/41 | 1 | OK | 505.99946 | 4934.67 | 67.3 | 0.037524 | 301.4 | 0.3429 | 0.3635 | 0.2055 | 0.49 | 284.4 | 301.5 | 243.5 | 5124 | 220.08 | 0.9106 | 7.52 | 0 |
| 42 | 37/42 | 2 | OK | 511.2008 | 4888.67 | 66.5 | 0.038137 | 304.5 | 0.3445 | 0.3676 | 0.205 | 0.4922 | 285.3 | 304.4 | 238.3 | 5078 | 220.11 | 0.9161 | 7.69 | 0 |
| 43 | 38/43 | 3 | OK | 506.76976 | 4896.67 | 64.9 | 0.042671 | 337.6 | 0.3441 | 0.3659 | 0.2054 | 0.4913 | 317.2 | 337.3 | 267.3 | 5066 | 220.06 | 0.9297 | 8.73 | 0 |
| 44 | 39/44 | 4 | OK | 532.35394 | 4918.67 | 65.2 | 0.040517 | 317.1 | 0.3435 | 0.3655 | 0.2051 | 0.4911 | 297.5 | 316.6 | 252 | 5108 | 220.09 | 0.9196 | 8.16 | 0 |
| 45 | 40/45 | 5 | OK | 522.11313 | 4881.67 | 67.1 | 0.038849 | 311 | 0.3446 | 0.3669 | 0.2053 | 0.4919 | 292.2 | 311.1 | 244.5 | 5071 | 220.09 | 0.9184 | 7.78 | 0 |
| 46 | 41/46 | 6 | OK | 515.06209 | 4900.67 | 66.8 | 0.038233 | 306.8 | 0.3439 | 0.3665 | 0.2053 | 0.4916 | 288 | 306.9 | 242.4 | 5096 | 220.08 | 0.9163 | 7.71 | 0 |
| 47 | 42/47 | 7 | OK | 559.71871 | 4894.67 | 65.8 | 0.041745 | 333.4 | 0.3443 | 0.3669 | 0.2051 | 0.4918 | 312.8 | 333.4 | 262.3 | 5084 | 220.08 | 0.9264 | 8.51 | 0 |
| 48 | 43/48 | 8 | OK | 511.03292 | 4888.67 | 66.5 | 0.038124 | 304.4 | 0.3445 | 0.3669 | 0.2052 | 0.4918 | 285.8 | 304.4 | 239.4 | 5078 | 220.04 | 0.9155 | 7.68 | 0 |
| 49 | 44/49 | 9 | OK | 507.5074 | 4900.67 | 66.6 | 0.037839 | 302.3 | 0.344 | 0.3657 | 0.2054 | 0.4912 | 284.4 | 302.4 | 240 | 5090 | 220.06 | 0.9151 | 7.62 | 0 |
| 52 | 44/52 | 10 | NG | 398.04831 | 4787.67 | 63.5 | 0.029062 | 237.1 | 0.3474 | 0.3681 | 0.2067 | 0.4928 | 223.8 | 237.2 | 183.3 | 4977 | 220.05 | 0.896 | 5.73 | 0 |
| 53 | 45/53 | 11 | OK | 523.66783 | 4894.67 | 66.5 | 0.039293 | 315.5 | 0.3442 | 0.3664 | 0.2053 | 0.4915 | 296.5 | 315.5 | 249.2 | 5084 | 220.04 | 0.9218 | 7.97 | 0 |
| 54 | 46/54 | 12 | OK | 519.25914 | 4910.67 | 66.7 | 0.03862 | 309.3 | 0.3442 | 0.366 | 0.2051 | 0.4913 | 290.4 | 309.2 | 245.2 | 5100 | 220.04 | 0.9167 | 7.79 | 0 |
| 55 | 47/55 | 13 | OK | 512.71174 | 4883.67 | 67.0 | 0.03862 | 309.3 | 0.3438 | 0.3668 | 0.2053 | 0.4918 | 286.8 | 309.2 | 245.2 | 5100 | 220.06 | 0.9191 | 7.79 | 0 |
| 56 | 48/56 | 14 | OK | 543.43415 | 4891.67 | 66.1 | 0.038113 | 305.4 | 0.3445 | 0.3666 | 0.2051 | 0.4918 | 286.8 | 305.4 | 240.4 | 5077 | 220.06 | 0.9121 | 7.65 | 0 |
| 57 | 49/57 | 15 | OK | 511.87233 | 4901.67 | 66.5 | 0.040448 | 323.7 | 0.3444 | 0.367 | 0.2051 | 0.4919 | 303.6 | 323.6 | 254.5 | 5081 | 220.06 | 0.9235 | 8.22 | 0 |
| 59 | 49/59 | 16 | NG | 407.4497 | 4766.67 | 68.5 | 0.029625 | 242.7 | 0.3461 | 0.3669 | 0.2069 | 0.4933 | 229 | 242.7 | 186.1 | 4956 | 220.05 | 0.8969 | 5.86 | 0 |
| 60 | 50/60 | 17 | OK | 494.44906 | 4904.67 | 66.2 | 0.037463 | 297.5 | 0.344 | 0.3666 | 0.205 | 0.4916 | 279.2 | 297.5 | 234.9 | 5094 | 220.09 | 0.9152 | 7.55 | 0 |
| 61 | 51/61 | 18 | OK | 532.18606 | 4889.67 | 65.5 | 0.040072 | 317 | 0.3441 | 0.3662 | 0.2052 | 0.4915 | 297.8 | 317 | 250.7 | 5088 | 220.07 | 0.9219 | 8.13 | 0 |
| 62 | 52/62 | 19 | OK | 524.73925 | 4887.67 | 67.0 | 0.038722 | 312.6 | 0.3445 | 0.3672 | 0.2051 | 0.492 | 293.2 | 312.5 | 245.4 | 5077 | 220.06 | 0.9189 | 7.83 | 0 |
| 63 | 53/63 | 20 | OK | 547.29544 | 4902.67 | 65.2 | 0.041201 | 326 | 0.344 | 0.3664 | 0.2051 | 0.4915 | 305.7 | 325.6 | 257.3 | 5092 | 220.03 | 0.9255 | 8.39 | 0 |
| 64 | 54/64 | 21 | OK | 520.93756 | 4898.67 | 65.9 | 0.039042 | 310.3 | 0.3441 | 0.3661 | 0.2053 | 0.4914 | 291.7 | 310.3 | 245.7 | 5088 | 220.03 | 0.9208 | 7.91 | 0 |
| 66 | 54/66 | 22 | NG | 424.40579 | 4772.67 | 69.8 | 0.030557 | 252.8 | 0.348 | 0.3692 | 0.2067 | 0.4934 | 236.3 | 252.8 | 193.7 | 4962 | 220.03 | 0.9043 | 6.08 | 0 |
| 67 | 55/67 | 23 | OK | 517.893 | 4877.67 | 66.7 | 0.037988 | 302.7 | 0.3448 | 0.3674 | 0.2053 | 0.4921 | 284.1 | 302.7 | 237.1 | 5067 | 220.04 | 0.9116 | 7.62 | 0 |
| 68 | 56/68 | 24 | OK | 519.93067 | 4891.67 | 65.9 | 0.038894 | 309.7 | 0.3444 | 0.3669 | 0.2052 | 0.4918 | 290.7 | 309.6 | 243.7 | 5081 | 220.07 | 0.9218 | 7.89 | 0 |
| 69 | 57/69 | 25 | OK | 525.13501 | 4872.67 | 66.6 | 0.039003 | 312.8 | 0.345 | 0.3685 | 0.205 | 0.4927 | 292.6 | 312.5 | 242.9 | 5062 | 220.05 | 0.9193 | 7.89 | 0 |
| 70 | 58/70 | 26 | OK | 508.01104 | 4888.67 | 66.9 | 0.037664 | 302.6 | 0.3444 | 0.3666 | 0.2053 | 0.4917 | 284.2 | 302.5 | 238.4 | 5078 | 220.05 | 0.9153 | 7.59 | 0 |
| 71 | 59/71 | 27 | OK | 515.39785 | 4896.67 | 67.0 | 0.038176 | 307 | 0.3442 | 0.3666 | 0.2052 | 0.4916 | 288.3 | 307 | 242.3 | 5086 | 220.05 | 0.9154 | 7.69 | 0 |

TESTING APPARATUS AND METHOD FOR TESTING LIGHT EMITTING DIODE LAMP

CROSS-REFERENCE TO RELATED APPLICATIONS

The present application claims priority under 35 U.S.C. §119(e) of Korean Patent Application No. 10-2010-0025488, filed on Mar. 22, 2010, and Korean Patent Application No. 10-2010-0025490, filed in the Republic of Korea on Mar. 22, 2010, which is hereby incorporated by reference for all purposes as if fully set forth herein.

BACKGROUND

This embodiment relates to a testing apparatus and a method for testing a light emitting diode (LED) lamp.

In general, a light emitting diode (hereinafter, referred to as LED) is an electronic component emitting light through recombination of minority carriers (electrons) injected into a p-n junction structure of a semiconductor.

An LED lamp manufactured with such an LED not only has a small size and a long life span but also directly converts electric energy into light energy so that it consumes low electric power and emits light with high efficiency and high intensity.

The LED responds at a high speed. Therefore, the LED is used as a numeric display device and a display lamp of various electronic equipments, for example, a display device of a vehicle dashboard, a light source for optical communication, etc., and is also variously used as lighting means for homes, vehicles, ships, traffic signals, various guide lamps and refuge guide lamps and the like.

SUMMARY

One embodiment is an apparatus for testing an LED lamp. The apparatus may include: a secured seat on which the LED lamp is seated; an up and down shifter which, when the LED lamp is seated on the secured seat, shifts from an initial position spaced upward from the LED lamp to a measurement position in which the up and down shifter contacts with a socket of the LED lamp, and which supplies electric power to the LED lamp when the up and down shifter is placed in the measurement position, and which includes a sensor sensing that the up and down shifter is placed in the measurement position; and a quality determining means determining, in response to the sensor's sensing that the up and down shifter is placed in the measurement position, a quality of the LED lamp based on light emitted from the LED lamp, and including an illuminometer or an luminance meter.

Another embodiment is an apparatus for testing an LED lamp. The apparatus may include: an optical characteristic measuring means including an illuminometer or an luminance meter and measuring an optical characteristic value of the LED lamp; an arithmetic means converting the optical characteristic value obtained by the optical characteristic measuring means into an optical characteristic value for directly determining whether the quality of the LED lamp is good or poor; and a quality determining means determining whether the quality of the LED lamp is good or poor on the basis of the optical characteristic value converted by the arithmetic means.

Further another embodiment is a method for testing an LED lamp. The method includes: measuring an optical characteristic value of the LED lamp by using an optical characteristic measuring means; converting the optical characteristic value into a value for determining whether the quality of the LED lamp is good or poor by using an arithmetic means and a predetermined numerical expression for obtaining a value for determining whether the quality of the LED lamp is good or poor based on the optical characteristic value; and determining whether the value for determining whether the quality of the lamp is good or poor is within a predetermined range, and wherein if the value is within the predetermined range, it is determined that the quality of the lamp is good, and wherein if the value is not within the predetermined range, it is determined that the quality of the lamp is poor.

BRIEF DESCRIPTION OF THE DRAWINGS

FIG. 6 shows an example of parameter input of an optical characteristic value and an electric power characteristic value which are gathered by the testing apparatus for testing the LED lamp of an exemplary embodiment.

FIG. 8 shows measurement result data obtained by using the illuminometer and a power meter of the testing apparatus of an exemplary embodiment.

DETAILED DESCRIPTION OF THE EMBODIMENTS

Figure 1:
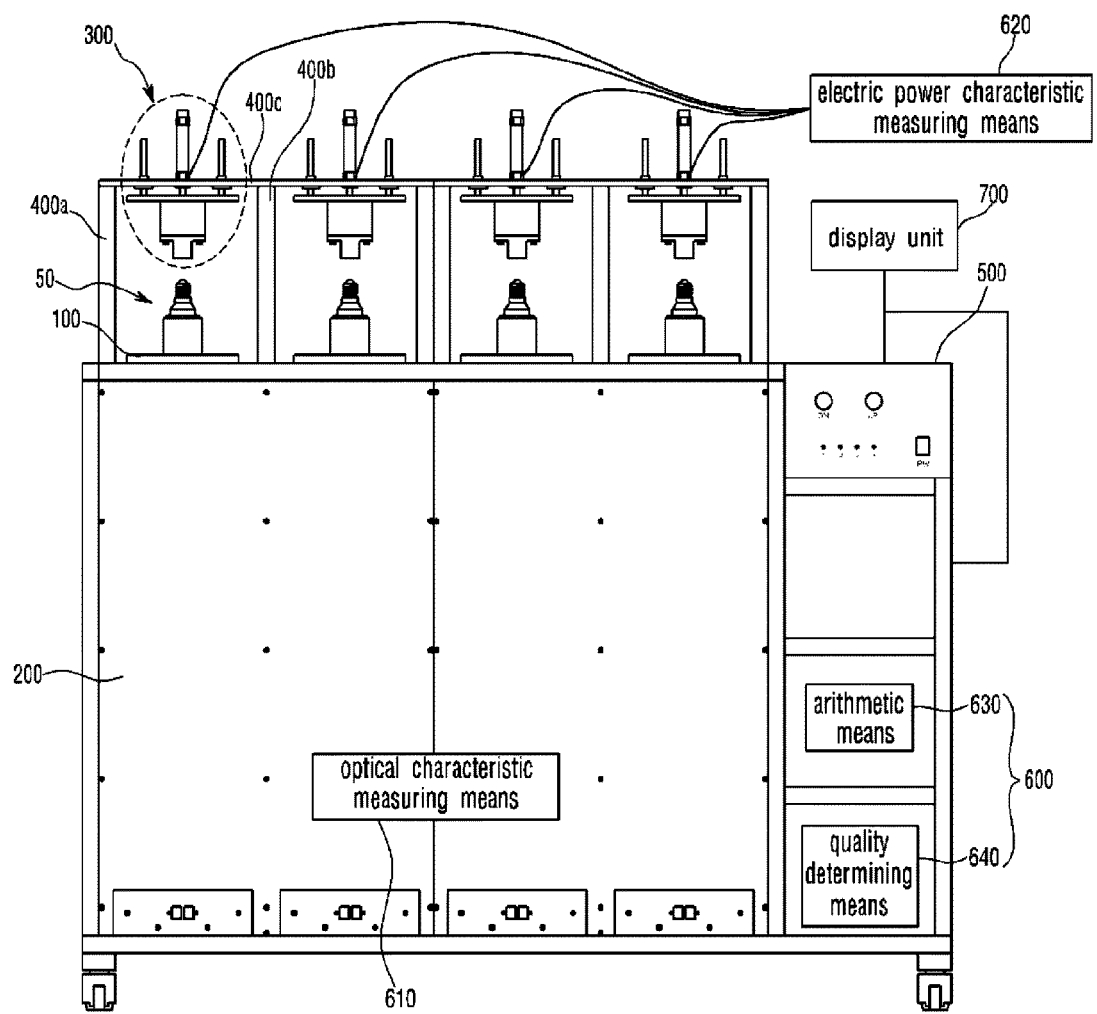
FIG. 1 is a front view of a testing apparatus for testing an LED lamp according to an exemplary embodiment.

Hereinafter, an embodiment will be described with reference to the accompanying drawings. The embodiment can be variously transformed, and the scope of this embodiment is not limited to the following embodiment. The shapes and sizes of the components in the drawings may be exaggerated for clarity of the description. The components indicated by the same reference numerals in the drawing correspond to the same components.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

FIG. 1 is a front view of a testing apparatus for testing an LED lamp according to an exemplary embodiment. Referring to FIG. 1, the testing apparatus for testing an LED lamp 50 may include a secured seat 100, an up and down shifter 300, a controller 500, a measurer 600 and a display unit 700.

The testing apparatus may include the secured seat 100 placed on the upper surface of a first body 200 so as to test the LED lamp. The secured seat 100 may include a groove into which the LED lamp 50 is inserted.

Plate type vertical support members 400a and 400b may be arranged on both sides of the secured seat 100 on the upper surface of the first body 200. A plate type horizontal support member 400c may be arranged on the upper surfaces of the vertical support members 400a and 400b. Here, the up and down shifter 300 may penetrate the horizontal support member 400c.

The LED lamp 50 may be tested through the following method. LEDs may be inserted into the groove of the secured seat 100, and electric power may be applied to the testing apparatus by pressing a power (PW) switch. The up and down shifter 300 may be shifted from a determined initial position to a measurement position and may be stopped by pressing a down (DN) switch provided in the controller 500 of the testing apparatus, and then the quality of the LED lamp 50 can be tested through the measurer 600. After the quality of the LED lamp 50 is tested, the display unit 700 may display whether the tested quality is good or poor. The display unit 700 may be connected to the controller 500 and the measurer 600. Here, the measurer 600 receives measured values from both an equipment (not shown) for measuring the optical characteristic, for example, an illuminometer, etc., disposed on the inner basal surface of the first body 200 and an equipment (not shown) for measuring electric power characteristic, for example, a power meter connected to the up and down shifter 300. It is possible to substitute the equipment for measuring the optical characteristic and the equipment for measuring electric power characteristic with a measuring apparatus.

After the LED lamp 50 is tested, the up and down shifter 300 may be shifted from the measurement position to the initial position and stopped by an UP switch provided in the controller 500. The up and down shifter 300 may be shifted up and down by supplying fluid pressure or pneumatic pressure to a cylinder provided to the inside of the up and down shifter 300.

In the test of the LED lamp 50, a plurality of the LED lamps 50 can be tested. In the embodiment, four LED lamps 50 can be simultaneously tested. It is also possible to test one to three LED lamps 50 instead of simultaneously testing four LED lamps 50. Besides, the embodiment may be changed such that various numbers of the LED lamps 50 can be tested without being limited to a specific number of the LED lamps 50.

Figure 2:
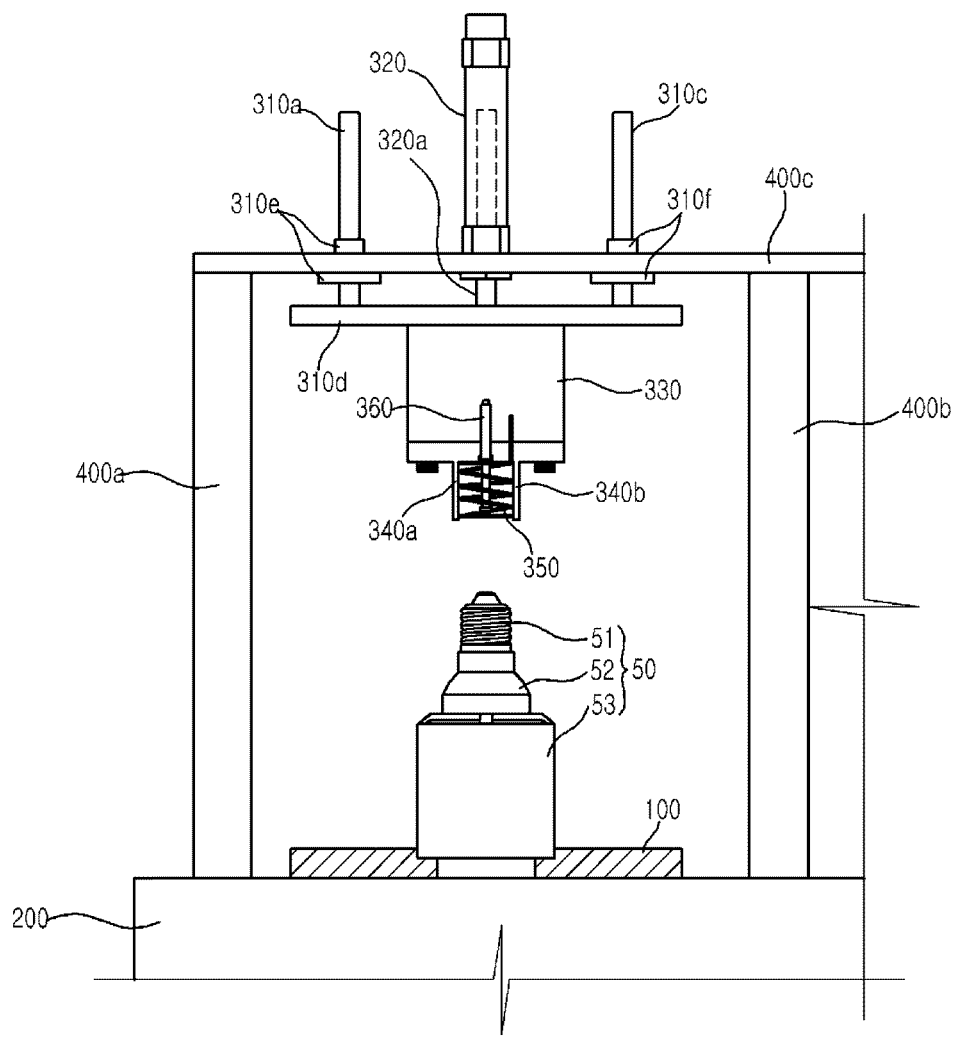
FIG. 2 is a cross sectional view of the testing apparatus for testing the LED lamp placed in an initial position in accordance with an exemplary embodiment.
Figure 3:
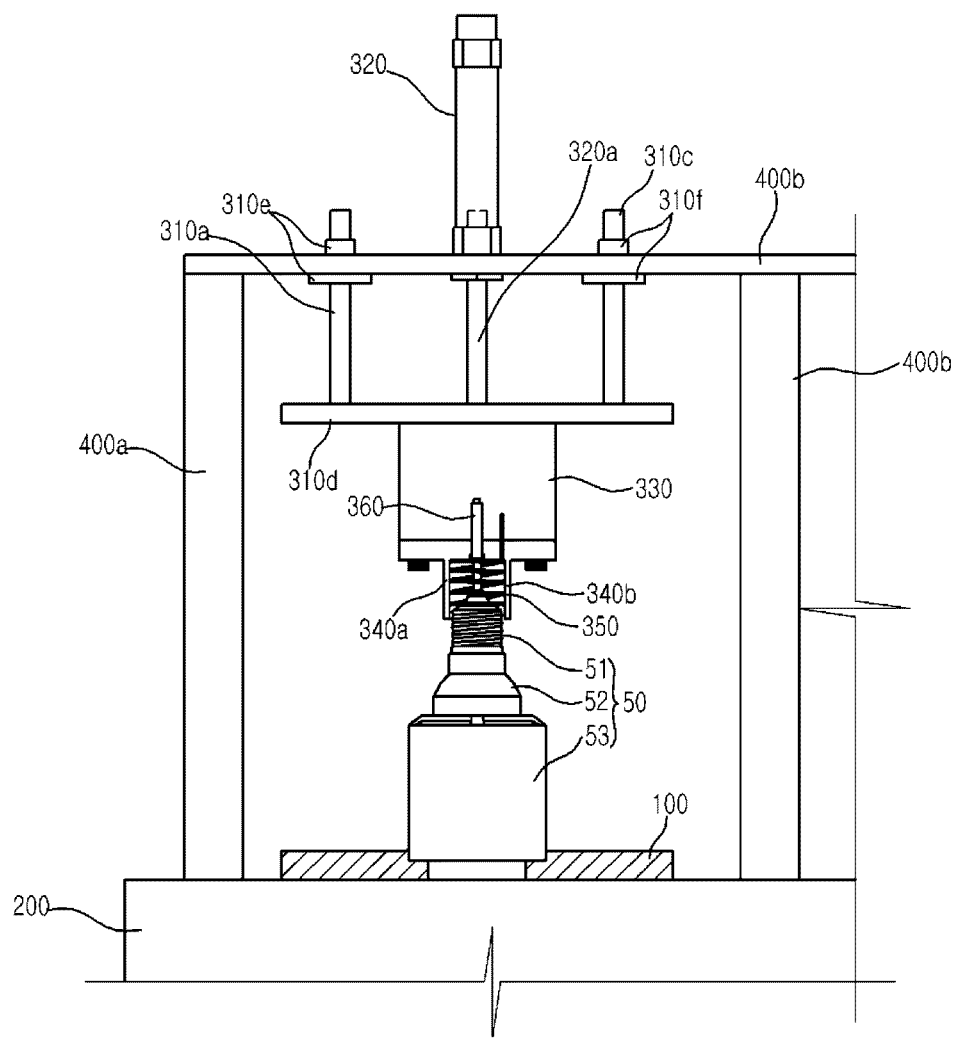
FIG. 3 is a cross sectional view of the testing apparatus for testing the LED lamp placed in a measurement position in accordance with an exemplary embodiment.

FIG. 2 is a cross sectional view of the testing apparatus for testing the LED lamp placed in an initial position in accordance with an exemplary embodiment. FIG. 3 is a cross sectional view of the testing apparatus for testing the LED lamp placed in a measurement position in accordance with this embodiment.

When the testing apparatus is placed in the initial position, as shown in FIG. 2, the lower part of a sensor 360 of the up and down shifter 300 may be spaced from the upper part of a socket 51 of the LED lamp 50. When the testing apparatus is placed in the measurement position, as shown in FIG. 3, the lower part of a sensor 360 of the up and down shifter 300 may come in contact with the upper part of a socket 51 of the LED lamp 50.

When the lower part of the sensor 360 contacts with the upper part of the socket 51 of the LED lamp 50, the sensor 360 may transfer a LED lamp 50 detection signal to the measurer 600 shown in FIG. 1. The measurer 600 may comprehensively measure the quality of the LED lamp 50 and displays the measurement result to the display unit 700. That is, the up and down shifter 300 may be shifted by as much as the height adjusted by the sensor 360 and may contact with the socket 51 so that electric power is applied to the lamp. The characteristic value of light irradiated downward may be measured by the illuminometer disposed on the inner basal surface of the first body 200. Simultaneously with this, the electric power characteristic value of the lamp may be measured by the power meter connected to the up and down shifter 300.

Referring to FIGS. 2 and 3, the LED lamp 50 may include the socket 51, a lamp 52 and a heat radiating part 53. The lamp 52 may be inserted into the secured seat 100. The LED lamp 50 may be inserted into the groove of the secured seat 100 in order to test the LED lamp 50.

The plate type vertical support members 400a and 400b may be placed on both sides of the secured seat 100 on the upper surface of the first body 200. The plate type horizontal support member 400c may be placed on the upper surface of the vertical support members 400a and 400b.

The horizontal support member 400c may include a cylinder 320 and guide rods 310a and 310c. The cylinder 320 may penetrate a hole formed in the horizontal support member 400c and moves up and down. The guide rods 310a and 310c may be arranged on both sides of the cylinder 320 along a longitudinal direction of the cylinder 320. More specifically, a piston 320a of the cylinder 320 may be vertically reciprocated through the hole formed in the horizontal support member 400c. The guide rods 310a and 310c can easily move in a sliding way through bearings 310e and 310f provided penetrating the horizontal support member 400c when the piston 320a of the cylinder 320 is vertically reciprocated.

In addition, a plate type horizontal member 310d may be attached to the lower surfaces of the cylinder 320 and the guide rods 310a and 310c. A second body 330 may be attached to the lower surface of the horizontal member 310d. Here, it is also possible that the second body 330 may be horizontally lengthened and attached to the lower surfaces of the cylinder 320 and the guide rods 310a and 310c instead of attaching the horizontal member 310d to the lower surfaces of the cylinder 320 and the guide rods 310a and 310c (FIGS. 2 and 3 show that the horizontal member 310d is attached). Here, since the horizontal member 310d may be attached to the lower surfaces of the cylinder 320 and the guide rods 310a and 310c, the cylinder 320 and the guide rods 310a and 310c may be fixed by the horizontal member 310d and it is unnecessary to increase the size of the second body 330.

The sensor 360 may be inserted into the lower part of the second body 330. The lower part of the sensor 360 is surrounded by an elastic member 350 such as a spring. The elastic member 350 protects the sensor 360 and provides an elastic force to the up and down shifter when the up and down shifter moves up.

Guides 340a and 340b may be formed on both sides of the elastic member 350. The guides 340a and 340b may prevent the elastic member 350 from meandering. The guides 340a and 340b may allow the elastic member 350 to vertically move up and down within the inside of the guides 340a and 340b.

Figure 4:
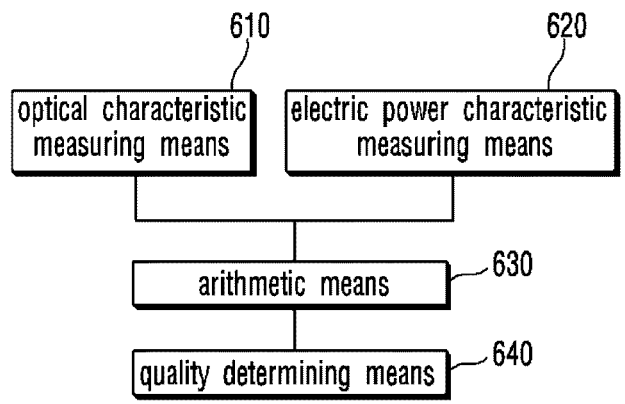
FIG. 4 shows an internal configuration of the testing apparatus for testing the LED lamp of FIG. 1.

FIG. 4 shows an internal configuration of the testing apparatus for testing the LED lamp of FIG. 1. Referring to FIG. 4, the apparatus for testing the LED lamp may include an optical characteristic measuring means 610, an electric power characteristic measuring means 620, an arithmetic means 630 and a quality determining means 640.

The optical characteristic measuring means 610 may measure an optical characteristic value of the LED lamp. The electric power characteristic measuring means 620 may include, for example, a power meter. The optical characteristic value may be obtained by measuring at least one selected from among illumination, chromaticity, a color coordinate and a color temperature of the LED lamp. The optical characteristic measuring means 610 may include, for example, the illuminometer (which may be referred to as a color temperature meter). Another kind of the optical characteristic measuring means, for example, a luminance meter can be used as an optical characteristic measuring means. The illuminometer may be able to measure the illumination, chromaticity, a color coordinate and a color temperature at a time. The response of a preferred illuminometer closely corresponds to that of a human being.

The optical characteristic value which the illuminometer can measure, as generally known, Ex[lx], x, y, u', v', X, Y, Z, $T_{CP}$[K]. Here, Ex[lx] indicates an illuminance and x, y, u' and v' indicate chromaticity. X, Y and Z indicate color coordinates. $T_{CP}$[K] indicates a color temperature.

The electric power characteristic measuring means 620 may measure the electric power characteristic value of the LED lamp. The electric power characteristic measuring means 620 may include, for example, a power meter. The electric power characteristic value may be obtained by measuring at least one selected from among an output voltage, power factor, power consumption, total harmonic distortion (THD) of the output voltage, or an input current of the LED lamp.

Through a predetermined numerical expression for obtaining a value for determining whether the quality of the LED lamp is good or poor based on the optical characteristic value and the electric power characteristic value, the arithmetic means 630 may convert the optical characteristic value and the electric power characteristic value into values for determining whether the quality of the LED lamp is good or poor. The predetermined numerical expression (i.e., a conversion expression) may include a numerical expression for obtaining speed of light, color temperature, light efficiency, color coordinate X, or color coordinate Y. For example, numerical expressions related to the parameters described above will be described in the following equations 1 to 5.

$$\text{speed of light} = EX[lx] \times 1 \quad \text{Equation (1)}$$

$$\text{color temperature} = Tcp + 2 \quad \text{Equation (2)}$$

$$\text{light efficiency} = \text{speed of light/power consumption} \times \text{correlation coefficient} \quad \text{Equation (3)}$$

$$\text{color coordinate } X = X + 1 \quad \text{Equation (4)}$$

$$\text{color coordinate } Y = Y + 1 \quad \text{Equation (5)}$$

The quality determining means 640 may determine whether the value for determining whether the quality of the lamp is good or poor is within a predetermined range. That is, if the value is within the predetermined range, the quality determining means 640 may determine that the quality of the lamp is good. If the value is not within the predetermined range, the quality determining means 640 may determine that the quality of the lamp is poor. The determining value for the quality of the lamp may include at least one of speed of light, color temperature of light, light efficiency, color coordinate X, or color coordinate Y of the LED lamp. If all the determining values for the quality of the lamp are within the predetermined range, the quality determining means 640 may determine that the quality of the LED lamp is good. This means that if any one of the determining values for the quality of the LED lamp is not within the predetermined range, corresponding optical characteristic or electric power characteristic is not satisfied, so that the quality determining means 640 may determine that the quality of the LED lamp is poor.

In this case, in order to determine the quality of the LED lamp in accordance with a user's selection, the quality determining means 640 can make use of not only speed of light, color temperature of light, light efficiency, and color coordinates but also a value measured by the optical characteristic measuring means 610 or the electric power characteristic measuring means 620.

Figure 5:
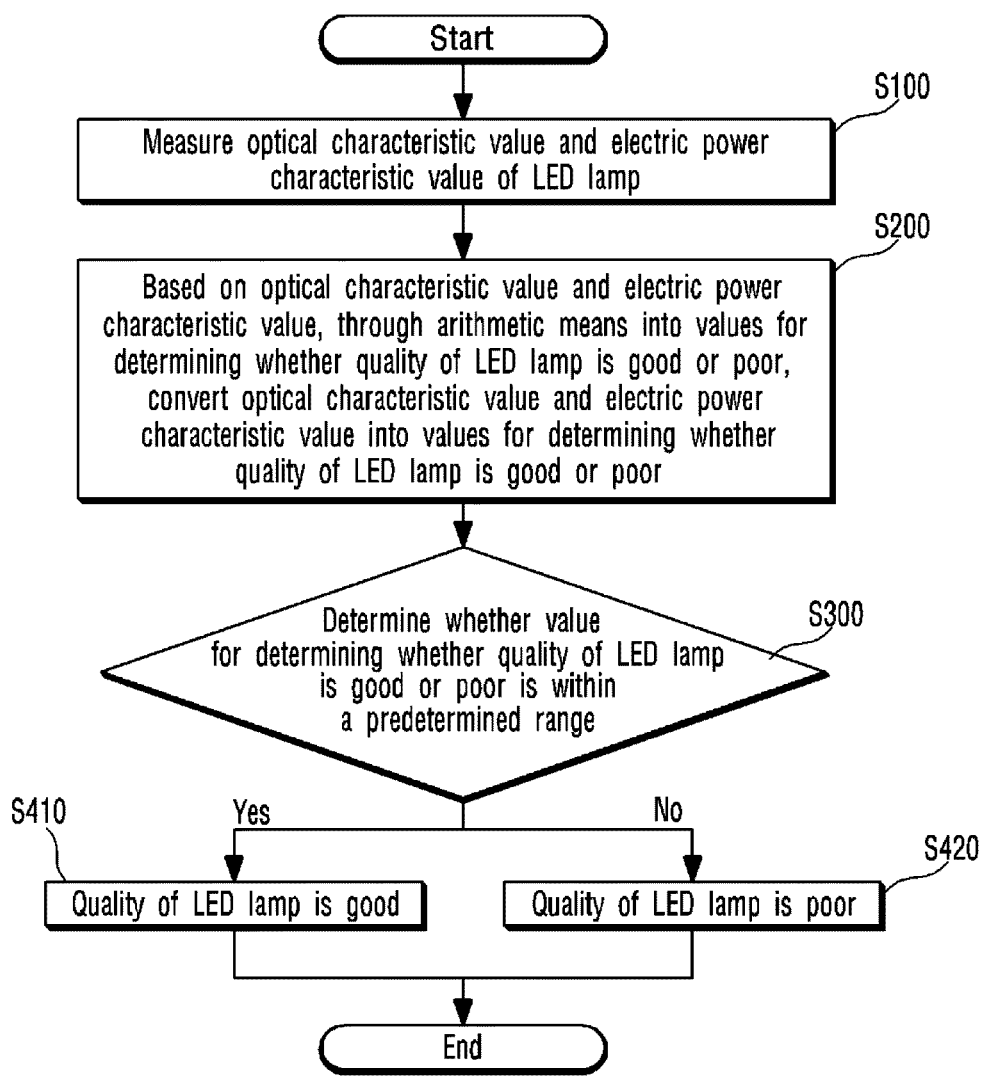
FIG. 5 is a flowchart showing a method for testing the LED lamp according to an exemplary embodiment.

FIG. 5 is a flowchart showing a method for testing the LED lamp according to an exemplified embodiment. FIG. 5 together with FIG. 4 will be described.

First, the optical characteristic value of the LED lamp may be measured by using the optical characteristic measuring means 610 and the electric power characteristic value of the LED lamp may be measured by using the electric power characteristic measuring means 620 (S100).

After the steps of S100 are completed, through a predetermined numerical expression for obtaining the value for determining whether the quality of the LED lamp is good or poor based on the optical characteristic value and the electric power characteristic value, the optical characteristic value and the electric power characteristic value may be converted by the arithmetic means 630 into the values for determining whether the quality of the LED lamp is good or poor (S200). The predetermined numerical expression may provide a standard for allowing a user to determine whether the quality of the LED lamp is good or poor in accordance with test data collected through repetitive measurements. That is, the predetermined numerical expression may change according to the kind of the LED lamp.

For example, in a conventional technology, testing the quality of the lamp may be performed by using speed of light, color temperature, light efficiency, a color coordinate value, or the like which are may be directly measured by an integrating sphere, etc. Here, when, by using data repeatedly measured several times, the optical characteristic values measured by the illuminometer and the like are compared with values actually measured by the integrating sphere, a certain correlation may be obtained. Based on such a constant correlation, the values measured by using only the optical characteristic measuring means 610 such as the illuminometer of this embodiment may be converted into the values measured by the integrating sphere, so that the converted values can be readily used to determine whether the quality of the LED lamp is good or poor.

After the step of S200, the quality determining means 640 may determine whether the value for determining whether the quality of the lamp is good or poor is within a predetermined range (S300). That is, if the value is within the predetermined range, the quality determining means 640 may determine that the quality of the lamp is good (S410). If the value is not within the predetermined range, the quality determining means 640 may determine that the quality of the lamp is poor (S420).

This embodiment may provide a LED lamp testing method described above through the steps of S100 to S420, thereby overcoming problems, for example, excessive test time, excessive test cost, and impossibility of a total test which are generated by using the integrating sphere.

Figure 6:
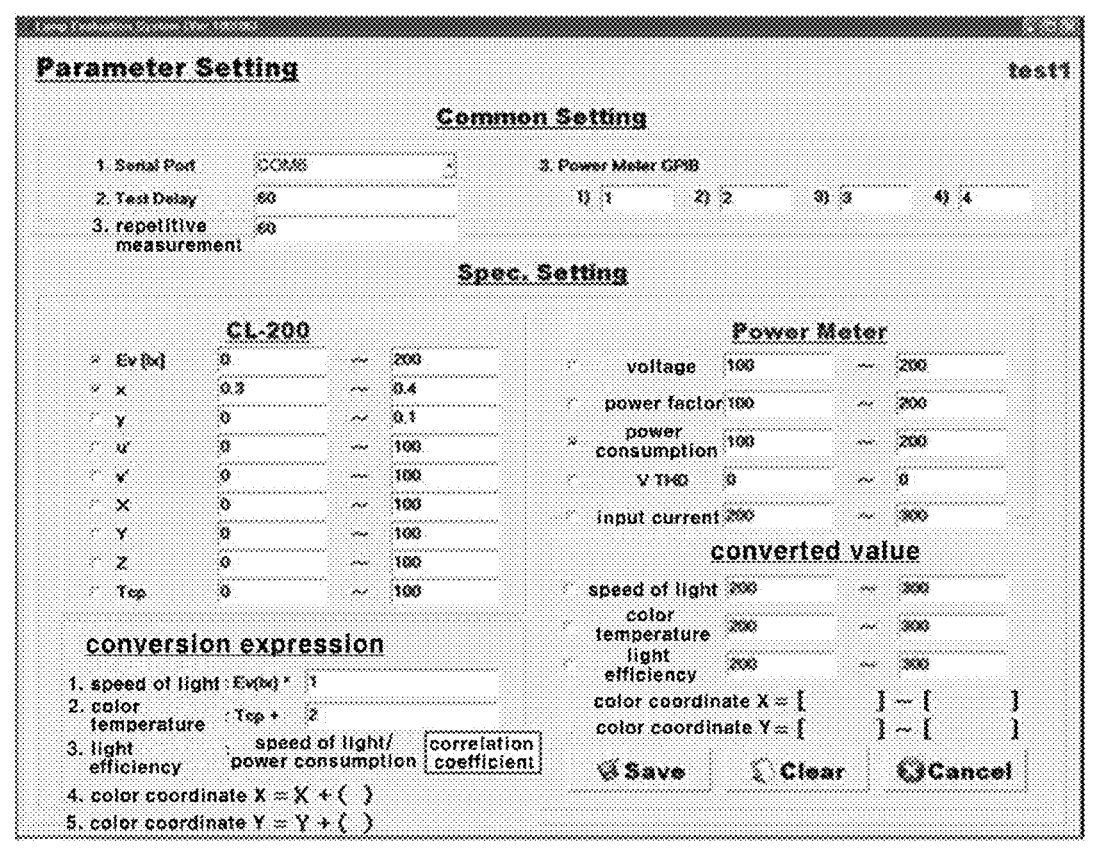

FIG. 6 shows an example of parameter input of the optical characteristic value and the electric power characteristic value of an exemplary embodiment. Referring to FIG. 6, the illuminometer and a power meter may be used as an optical characteristic measuring means and an electric power characteristic measuring means respectively.

Symbols of Ex[lx], x, y, u', v', X, Y, Z and TCP[° C.] (hereinafter, each symbol has the same meaning as the meaning defined in FIG. 4) can be set on the left side of FIG. 6. An output voltage, power factor, power consumption, total harmonic distortion (THD) of the output voltage, and an input current of the LED lamp can be set on the right side of FIG. 6.

A conversion expression for obtaining the speed of light, color temperature, light efficiency, color coordinate X, or color coordinate Y can be set in the bottom left side of FIG. 6. A speed of light, color temperature, light efficiency, color coordinate X, and color coordinate Y can be set in the bottom right side of FIG. 6. Particularly, it is possible to measure the speed of light during the testing of an LED lamp. In this embodiment, it is possible to simply measure the speed of light through the measurement of the illuminance of the light and through the predetermined numerical expression. In other words, while it is possible to measure the speed of light only through the use of an integrating sphere in conventional technology, it is possible to simply measure the speed of light without the use of an integrating sphere in this embodiment.

Figure 7:
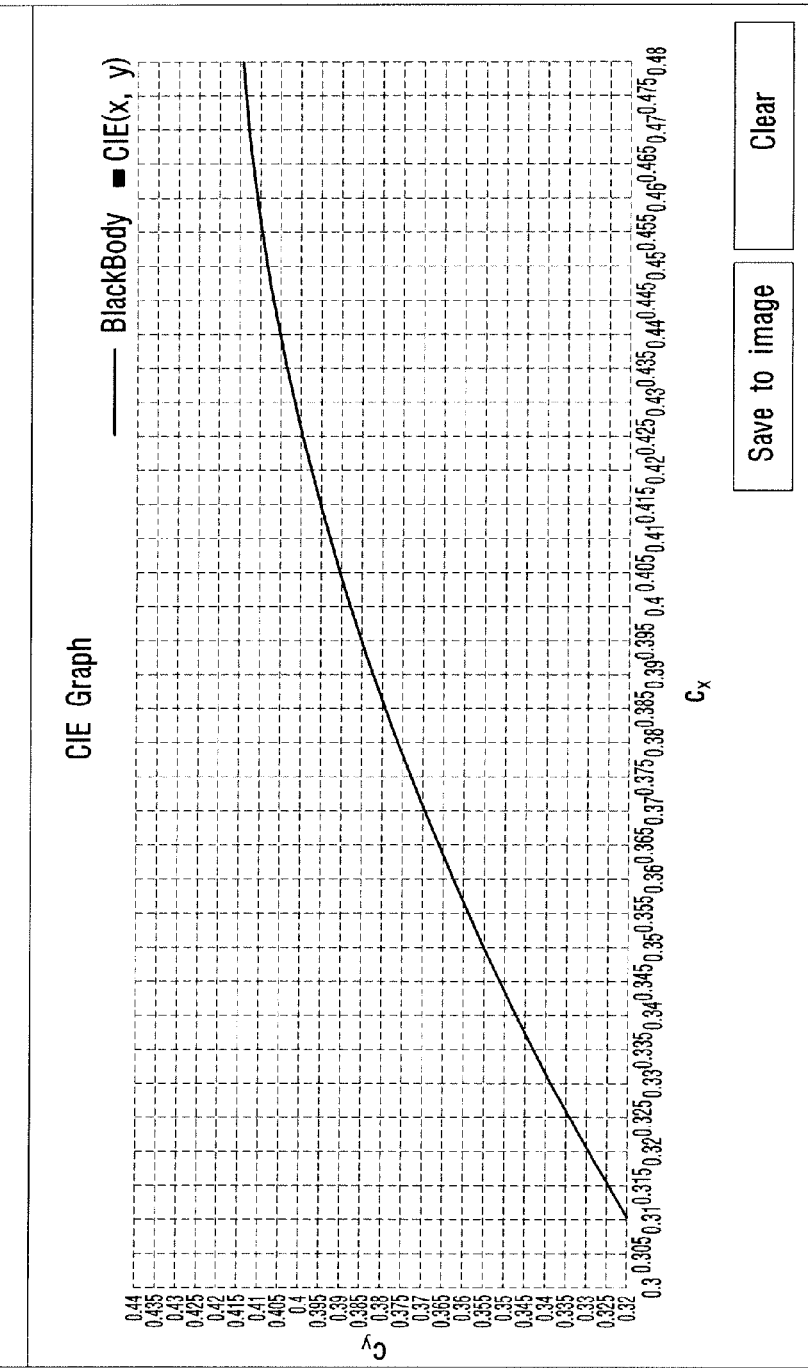
FIG. 7 is a distribution chart of a color coordinate measured by using an illuminometer of the testing apparatus of an exemplary embodiment.

FIG. 7 includes a distribution chart of color coordinates measured by using the illuminometer of this embodiment. Referring to the upper part of FIG. 7, with detail included in FIG. 8, shows and example of data of a measurement result that may include, speed of light, color temperature, light efficiency, input current, Ex[lx], x, y, u', v', X, Y, and Z. A graph in the lower part of FIG. 7 shows chromaticity distribution measured by the illuminometer. That is, such data is measured by the illuminometer and is later converted through predetermined numerical expressions, e.g., the equations (1) to (5).

FIG. 8 shows an example of measurement result data obtained by using the illuminometer and a power meter of this embodiment. FIG. 8 shows speed of light, color temperature, light efficiency, input current, Ex[lx], x, y, u', v', X, Y, Z, voltage, current, power factor, power consumption, and V THD in order. For example, as a Pass/Total it can be seen that an LED lamp having an order of 41 has passed 36th the quality test and five LED lamps have failed the quality test prior to the quality test of the LED lamp having an order of 41.

Further, it can be understood that an LED lamp having an order of 52 has passed 44th the quality test and eight LED lamps have failed the quality test prior to the quality test of the LED lamp having an order of 52.

This embodiment is not limited to the embodiment described above and the accompanying drawings. The scope of rights of this embodiment is intended to be limited by the appended claims. It will be understood by those skilled in the art that various substitutions, modification and changes in form and details may be made therein without departing from the spirit and scope of this embodiment as defined by the appended claims.

What is claimed is:

1. An apparatus for testing an LED lamp, the apparatus comprising:
 a secured seat on which an LED lamp is seated;
 an up and down shifter which shifts from an initial position spaced upward from the LED lamp to a measurement position in which supplies electric power to the LED lamp;
 a first sensor sensing that the up and down shifter is placed in the measurement position; and
 a quality determining means comprising an illuminometer or an luminance meter for determining, in response to the first sensor's sensing that the up and down shifter is placed in the measurement position, a quality of the LED lamp based on light emitted from the LED lamp
 wherein the electric power is supplied to the LED lamp when the first sensor senses the up and down shifter is placed in the measurement position, and the electric power is not supplied to the LED lamp when the up and down shifter is not placed in the measurement position.

2. The apparatus of claim 1, wherein the secured seat is placed on an upper surface of a first body, and wherein the up and down shifter further comprises:
 a vertical support member placed on the first body; and
 a horizontal support member placed on the vertical support member.

3. The apparatus of claim 2, wherein the up and down shifter further comprises a cylinder penetrating a hole formed in the horizontal support member and moving up and down.

4. The apparatus of claim 3, wherein the up and down shifter further comprises a guide rod arranged on both sides of the cylinder along a longitudinal direction of the cylinder, and wherein the guide rod penetrating a hole formed in the horizontal support member and moving up and down.

5. The apparatus of claim 4, wherein the up and down shifter further comprises a bearing provided penetrating the horizontal support member.

6. An apparatus for testing an LED lamp, the apparatus comprising:
 a secured seat on which the LED lamp is seated;
 an up and down shifter which shifts from an initial position spaced upward from the LED lamp to a measurement position in which supplies electric power to the LED lamp;
 a first sensor sensing that the up and down shifter is placed in the measurement position; and
 a quality determining means comprising an illuminometer or an luminance meter for determining, in response to the first sensor's sensing that the up and down shifter is placed in the measurement position, a quality of the LED lamp based on light emitted from the LED lamp wherein the up and down shifter further comprises a second body and wherein the first sensor is disposed in the second body.

7. The apparatus of claim 6, further comprising a horizontal member placed between the guide rod and a second body.

8. An apparatus for testing an LED lamp, the apparatus comprising:
 a secured seat on which the LED lamp is seated;
 an up and down shifter which shifts from an initial position spaced upward from the LED lamp to a measurement position in which supplies electric power to the LED lamp;
 a first sensor sensing that the up and down shifter is placed in the measurement position; and
 a quality determining means comprising an illuminometer or an luminance meter for determining, in response to the first sensor's sensing that the up and down shifter is placed in the measurement position, a quality of the LED lamp based on light emitted from the LED lamp wherein a part of the first sensor is surrounded by an elastic member.

9. The apparatus of claim 8, wherein a guide preventing the elastic member from meandering is formed on both sides of the elastic member.

10. The apparatus of claim 1, wherein the quality determining means further comprises a measuring apparatus.

11. The apparatus of claim 1, wherein the measurement position is the point where the up and down shifter contacts with a socket of the LED lamp.

12. The apparatus of claim 1, wherein the up and down shifter comprises the first sensor.

13. The apparatus of claim 1, wherein the up and down shifter is located above the secured seat.

14. The apparatus of claim 1, wherein the first sensor moves according to movement of the up and down shifter.

15. The apparatus of claim 1, wherein the quality determining means further comprises an illuminometer or a luminance meter.

16. The apparatus of claim 6, wherein the second body is attached to a cylinder and a guide rod.

17. The apparatus of claim 8, wherein the part of the first sensor surrounded by the elastic member is a lower part.

\* \* \* \* \*